(12) United States Patent
Okamoto et al.

(10) Patent No.: US 8,341,579 B2
(45) Date of Patent: Dec. 25, 2012

(54) METHOD, APPARATUS, AND SYSTEM FOR ANALYZING OPERATION OF SEMICONDUCTOR INTEGRATED CIRCUITS

(75) Inventors: Takumi Okamoto, Tokyo (JP); Takeshi Watanabe, Kanagawa (JP); Itsuki Yamada, Kanagawa (JP); Naoshi Doi, Kanagawa (JP); Tsuneo Tsukagoshi, Tokyo (JP)

(73) Assignee: NEC Corporation, Tokyo (JO)

( * ) Notice: Subject to any disclaimer, the term of this patent is extended or adjusted under 35 U.S.C. 154(b) by 0 days.

(21) Appl. No.: 13/062,263

(22) PCT Filed: Oct. 27, 2009

(86) PCT No.: PCT/JP2009/005672
§ 371 (c)(1),
(2), (4) Date: Jun. 6, 2011

(87) PCT Pub. No.: WO2010/050188
PCT Pub. Date: May 6, 2010

(65) Prior Publication Data
US 2011/0296369 A1   Dec. 1, 2011

(30) Foreign Application Priority Data
Oct. 27, 2008   (JP) .............................. 2008-275878

(51) Int. Cl.
*G06F 17/50* (2006.01)

(52) U.S. Cl. ........ 716/115; 716/106; 716/109; 716/111; 716/112; 716/137

(58) Field of Classification Search .......... 716/106–115, 716/137
See application file for complete search history.

(56) References Cited

U.S. PATENT DOCUMENTS

| 7,246,335 | B2 * | 7/2007 | Murgai et al. ................. 716/113 |
| 7,831,949 | B2 * | 11/2010 | Tokunaga et al. ............. 716/137 |
| 2003/0057966 | A1 * | 3/2003 | Shimazaki et al. ........... 324/628 |
| 2006/0036980 | A1 * | 2/2006 | Kobayashi ......................... 716/4 |
| 2007/0067747 | A1 * | 3/2007 | Checka et al. .................... 716/5 |

FOREIGN PATENT DOCUMENTS

| JP | 6-18626 A | 1/1994 |
| JP | 8-63510 A | 3/1996 |

(Continued)

OTHER PUBLICATIONS

International Search Report for PCT/JP2009/005672 mailed Dec. 8, 2009.

*Primary Examiner* — Nha Nguyen

(57) ABSTRACT

An operation analyzing apparatus (100) for semiconductor integrated circuits according to this exemplary embodiment includes a simulation analyzing unit (140), and the simulation analyzing unit (140) includes: a semiconductor characteristics extracting unit (110) that extracts the inductances L, resistances R, and capacitances C of a board, a package, and a semiconductor integrated circuit, from the semiconductor integrated circuit mounted on the board via the package; an individual network generating unit (111) that generates individual networks of the extracted inductance L, resistance R, and capacitance C with respect to each of said semiconductor substrate, said package, and said semiconductor integrated circuit; an integrated network generating unit (112) that generates an integrated network by integrating all of the generated individual networks; and an operation simulation running unit (113) that performs an operation simulation of the semiconductor integrated circuit by inserting a test noise pattern to an arbitrary position in the generated integrated network.

9 Claims, 7 Drawing Sheets

FOREIGN PATENT DOCUMENTS

| | | |
|---|---|---|
| JP | 2000035984 A | 2/2000 |
| JP | 2002270695 A | 9/2002 |
| JP | 2004085477 A | 3/2004 |
| JP | 2006031510 A | 2/2006 |
| JP | 2006244325 A | 9/2006 |
| JP | 2007233454 A | 9/2007 |
| JP | 2009503668 A | 1/2009 |
| JP | 2009526285 A | 7/2009 |

* cited by examiner

METHOD, APPARATUS, AND SYSTEM FOR ANALYZING OPERATION OF SEMICONDUCTOR INTEGRATED CIRCUITS

This application is the National Phase of PCT/JP2009/005672, filed Oct. 27, 2009, which is based upon and claims the benefit of priority from Japanese patent application No. 2008-275878, filed on Oct 27, 2008, the disclosure of which is incorporated herein in its entirety by reference.

TECHNICAL FIELD

The present invention relates to an operation analyzing method, an operation analyzing apparatus, an operation analyzing program, and an operation analyzing system for semiconductor integrated circuits.

BACKGROUND ART

In recent years, there have been semiconductor integrated circuits that operate at higher speeds and lower voltages, thanks to progress and development of miniaturization techniques. However, the resistance to exogenous noise that enters from outside via a power supply line, or the noise immunity, is becoming lower and lower.

Therefore, to consider and take measures to improve the noise immunity, it is essential that the influence of exogenous noise on operations of semiconductor integrated circuits is analyzed, and the mechanism of the influence is made clear.

There have been two known methods for analyzing operations of semiconductor integrated circuits. According to one of the methods, noise is applied to a completed actual device from outside by a certain technique, and the cause of a false operation is analyzed by observing the operation of the device from outside. According to the other one of the methods, the inside of a subject semiconductor integrated circuit is modeled on a so-called "LRC network", which is expressed by inductances L, resistances R, and capacitances C, based on design information used for manufacture. A noise source is inserted to the LRC network, and an analysis is made through a simulation.

Hereinafter, the first method will be referred to as an "analysis technique through actual measurement," and the second method will be referred to as an "analysis technique through a simulation." As a technique related to analyses of operations of semiconductor integrated circuits with the influence of exogenous noise taken into consideration, a noise immunity evaluating device is disclosed as an "analysis technique through actual measurement" in Patent Document 1. Meanwhile, an electromagnetic wave interference analyzing apparatus is disclosed as an "analysis technique through a simulation" in Patent Document 2.

The noise immunity evaluating device disclosed in Patent Document 1 actually measures an operation of a semiconductor integrated circuit by applying a square wave as noise to an arbitrary location on a board. On the other hand, the electromagnetic wave interference analyzing apparatus disclosed in Patent Document 2 models a power supply interconnect inside a semiconductor integrated circuit and a power supply interconnect outside the semiconductor integrated circuit on an equivalent circuit, and performs a simulation by supplying a noise waveform to the equivalent circuit. In this manner, the electromagnetic wave interference analyzing apparatus analyzes the influence of noise on the semiconductor integrated circuit.

PRIOR ART DOCUMENTS

[Patent Documents]
[Patent Document 1]
Japanese Laid-Open Patent Publication No. 2004-85477
[Patent Document 2]
Japanese Laid-Open Patent Publication No. 2002-270695

DISCLOSURE OF THE INVENTION

However, the above techniques disclosed in Patent Documents 1 and 2 have room for improvement in the following aspects.

First, the technique disclosed in Patent Document 1 has the advantage of being able to accurately analyze a possible false operation by actually operating a semiconductor integrated circuit. However, by this technique, the inside of the semiconductor integrated circuit cannot be freely observed, and therefore, has to be regarded as a "black box". It is difficult to analyze the details of the operation of the inside of a semiconductor integrated circuit. That is, it is difficult to specifically determine which part of the inside of a semiconductor integrated circuit is the cause of a false operation.

In a case where a mechanism for preventing false operations is provided in a semiconductor integrated circuit, it is necessary to analyze the details of operations of the inside of the semiconductor integrated circuit. In this aspect, the technique disclosed in Patent Document 1 has a limitation.

Secondly, the technique disclosed in Patent Document 2 has the advantage of being able to analyze the details of operations of the inside of a semiconductor integrated circuit. However, the analysis results are not always consistent with operations of the semiconductor integrated circuit. Even if the cause of a false operation is determined through a simulation, there is no guarantee that the determined cause is actually the cause of a false operation in an actual operation of the semiconductor integrated circuit.

This is because, according to Patent Document 2, the power supply interconnects inside and outside a semiconductor integrated circuit are modeled as an equivalent circuit, and an operation analysis is carried out by supplying a noise waveform to the equivalent circuit to perform a simulation.

As semiconductor integrated circuits are being used in various environments in recent years, various kinds of non-rated noise might enter semiconductor integrated circuits via various locations on boards or packages.

To carry out an accurate operation analysis under such circumstances, a semiconductor integrated circuit and a package and board provided outside the semiconductor integrated circuit need to be accurately modeled, and a noise pattern accurate with respect to the shape of noise, the application location of noise, and timing of noise application needs to be applied so as to certainly cause a false operation in the semiconductor integrated circuit. At the same time, an appropriate noise pattern that can certainly cause a false operation in the semiconductor integrated circuit needs to be used so that an operation simulation can be accurately performed.

Therefore, a check needs to be made whether the results of analyses of circuit operations through simulations where various kinds of noise patterns are applied can also be seen in actual operations of the semiconductor integrated circuit.

This is because there is not only a need to check the operation of a logic circuit in a semiconductor integrated circuit, but also a need to simulate the influence of noise on the outside package or board.

In short, with respect to the accuracies of noise patterns and simulation models, there is a demand for a high consistency of each simulation with an actual operation of a semiconductor integrated circuit, and it is difficult to accurately analyze an operation of a semiconductor integrated circuit by taking into consideration the influence of exogenous noise.

The present invention has been made in view of the above circumstances, and the object thereof is to provide an operation analyzing method, an operation analyzing apparatus, an operation analyzing program, and an operation analyzing system for semiconductor integrated circuits. The method, device, program, and system enable accurate analyses of operations of semiconductor integrated circuits, with the influence of exogenous noise being taken into consideration.

According to the present invention, there is provided an operation analyzing method for analyzing an operation of a semiconductor integrated circuit, including: extracting respective inductances, resistances, and capacitances of a semiconductor substrate, a package, and the semiconductor integrated circuit, from the semiconductor integrated circuit mounted on the semiconductor substrate via the package; generating individual networks of the extracted inductance, resistance, and capacitance with respect to each of the semiconductor substrate, the package, and the semiconductor integrated circuit; generating an integrated network by integrating all of the individual networks generated; and inserting a test noise pattern to an arbitrary position in the integrated network generated, and performing an operation simulation of the semiconductor integrated circuit.

According to the present invention, there is provided n operation analyzing apparatus for semiconductor integrated circuits including: a semiconductor characteristics extracting unit which extracts respective inductances, resistances, and capacitances of semiconductor substrate, a package, and a semiconductor integrated circuit, from the semiconductor integrated circuit mounted on the semiconductor substrate via the package; an individual network generating unit which generates individual networks of the extracted inductance, resistance, and capacitance with respect to each of the semiconductor substrate, the package, and the semiconductor integrated circuit; an integrated network generating unit which generates an integrated network by integrating all of the generated individual networks; and an operation simulating unit which inserts a test noise pattern to an arbitrary position in the generated integrated network, and performs an operation simulation of the semiconductor integrated circuit.

An operation analyzing program for a semiconductor integrated circuit, the operation analyzing program causing a computer to perform: a semiconductor characteristics extracting procedure to extract respective inductances, resistances, and capacitances of a semiconductor substrate, a package, and the semiconductor integrated circuit, from the semiconductor integrated circuit mounted on the semiconductor substrate via the package; an individual network generating procedure to generate individual networks of the extracted inductance, resistance, and capacitance with respect to each of the semiconductor substrate, the package, and the semiconductor integrated circuit; an integrated network generating procedure to generate an integrated network by integrating all of the individual networks generated; and an operation simulating procedure to insert a test noise pattern to an arbitrary position in the integrated network generated, and perform an operation simulation of the semiconductor integrated circuit.

An operation analyzing system for a semiconductor integrated circuit, including: a semiconductor characteristics extracting unit which extracts respective inductances, resistances, and capacitances of a semiconductor substrate, a package, and the semiconductor integrated circuit, from the semiconductor integrated circuit mounted on the semiconductor substrate via the package; an individual network generating unit which generates individual networks of the extracted inductance, resistance, and capacitance with respect to each of the semiconductor substrate, the package, and the semiconductor integrated circuit; an integrated network generating unit which generates an integrated network by integrating all of the individual networks generated; an operation simulating unit which inserts a test noise pattern to an arbitrary position in the integrated network generated, and performs an operation simulation of the semiconductor integrated circuit; a noise analyzing unit which analyzes operations occurring due to the test noise pattern inserted based on a result of the operation simulation performed; an exogenous noise applying unit which applies the test noise pattern as a first exogenous noise from outside the semiconductor integrated circuit, when the operation detected is caused by the test noise pattern; and a device analyzing unit which carries out a device analysis through an actual operation of the semiconductor integrated circuit to which the first exogenous noise is applied.

It should be noted that any combinations of the above components are also valid as exemplary embodiments of the present invention, and the wordings used in the present invention may be switchably used for describing a method, a device, a system, a recording medium, and a computer program as exemplary embodiments of the present invention.

Also, the various components of the present invention are not necessarily independent of one another. Instead, two or more components may be formed as a single element, a single component may be formed by two or more elements, a component may be part of another component, or part of a component may be part of another component, for example.

Although the procedures according to the method and the computer program of the present invention are described in order of execution, the order described herein does not limit the order of execution of the procedures. Therefore, when the method and the computer program of the present invention are executed, the order of the procedures can be changed, without any adverse influence on the contents of the procedures.

Further, the procedures according to the method and the computer program of the present invention are not necessarily performed at different times from one another. Therefore, a procedure may be carried out while another procedure is being carried out, or execution of a procedure may overlap with execution of another procedure in terms of timing, entirely or partly, for example.

The present invention is to provide an operation analyzing method, an operation analyzing apparatus, an operation analyzing program, and an operation analyzing system for semiconductor integrated circuits. The method, device, program, and system enable accurate analyses of operations of semiconductor integrated circuits, with the influence of exogenous noise being taken into consideration.

BRIEF DESCRIPTION OF THE DRAWINGS

The above and other objects, features and advantages of the present invention will become more apparent from the following description of certain preferred exemplary embodiments taken in conjunction with the accompanying drawings.

BEST MODE FOR CARRYING OUT THE INVENTION

Figure 1:
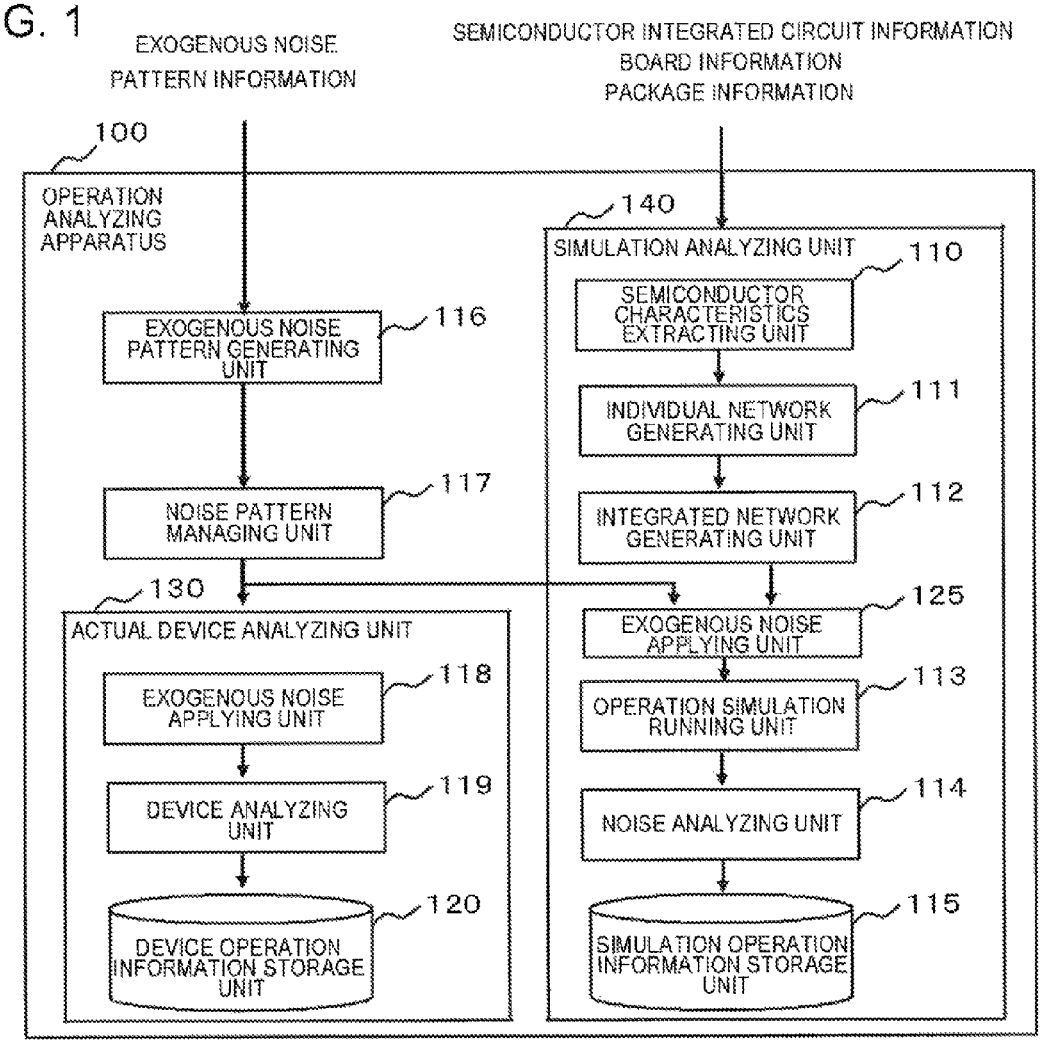
FIG. 1 is a block diagram showing the structure of an operation analyzing apparatus for semiconductor integrated circuits according to an exemplary embodiment of the present invention.

The following is a description of exemplary embodiments of the present invention, with reference to the accompanying drawings. In all the drawings, like components are denoted by like reference numerals, and description of them will not be repeated.

(First Exemplary Embodiment)

The following is a description of an exemplary embodiment of the present invention, with reference to the drawings. FIG. 1 is a block diagram showing the structure of an operation analyzing apparatus 100 for semiconductor integrated circuits according to this exemplary embodiment.

The operation analyzing apparatus 100 for semiconductor integrated circuits according to this exemplary embodiment includes a simulation analyzing unit 140 that analyzes an operation of a semiconductor integrated circuit. The simulation analyzing unit 140 includes: a semiconductor characteristics extracting unit 110 that extracts the inductances L, resistances R, and capacitances C of a board, a package, and the semiconductor integrated circuit, from the semiconductor integrated circuit mounted on the board (a semiconductor substrate) via the package; an individual network generating unit 111 that generates individual networks of the extracted inductance L, resistance R, and capacitance C with respect to each of the semiconductor substrate, the package, and the semiconductor integrated circuit; an integrated network generating unit 112 that generates an integrated network by integrating all of the generated individual networks; and an operation simulation running unit 113 that performs an operation simulation of the semiconductor integrated circuit by inserting a test noise pattern to an arbitrary position in the generated integrated network.

The simulation analyzing unit 140 also includes a noise analyzing unit 114, a simulating operation information storage unit 115, and an exogenous noise applying unit 125.

The operation analyzing apparatus 100 also includes an exogenous noise pattern generating unit 116, a noise pattern managing unit 117, and an actual operation device analyzing unit 130.

The actual operation device analyzing unit 130 includes an exogenous noise applying unit 118, a device analyzing unit 119, and a device operation information storage unit 120.

The semiconductor characteristics extracting unit 110 extracts the inductances L, resistances R, and capacitances C of the package, the board, and the semiconductor integrated circuit, as a user uses a user interface unit (not shown) to input package information, board information, and semiconductor integrated circuit information, their selves or those as data files, by downloading from a network (not shown) or reading from a storage device or any one of various kinds of recording media. The semiconductor characteristics extracting unit 110 transmits the extracted respective inductances L, resistances R, and capacitances C, to the individual network generating unit 111. The extraction of the values of the inductances L, resistances R, and capacitances C can be performed by an existing technique. Therefore, in this exemplary embodiment, those values may be extracted by any technique, and the extraction unit is not particularly limited.

Upon receipt of the extracted inductances L, resistances R, and capacitances C, the individual network generating unit 111 generates individual networks of an inductance L, a resistance R, and a capacitance C with respect to each of the package, the board, and the semiconductor integrated circuit. The individual network generating unit 111 transmits the generated respective individual networks to the integrated network generating unit 112.

Upon receipt of the generated respective individual networks from the individual network generating unit 111, the integrated network generating unit 112 integrates the individual networks of the package, the board, and the semiconductor integrated circuit, and generates a semiconductor integrated LRC network (an integrated network).

Figure 2:
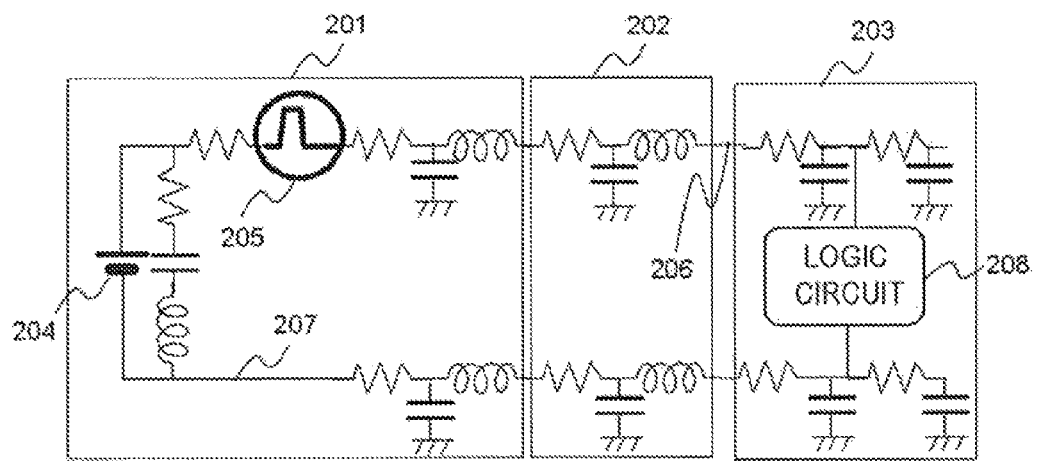
FIG. 2 is a schematic view showing a semiconductor integrated LRC network according to the exemplary embodiment.

An example of the semiconductor integrated LRC network is now described, with reference to a drawing. FIG. 2 is a schematic view showing a generated semiconductor integrated LRC network.

The semiconductor integrated LRC network shown in FIG. 2 includes an individual network formed by a board 201, an individual network formed by a package 202, and an individual network formed by a semiconductor integrated circuit 203.

The board 201 includes a power supply 204, a noise source 205, and a ground line 207. The package 202 includes a power supply line 206 and the ground line 207. The semiconductor integrated circuit 203 includes the power supply line 206, the ground line 207, and a logic circuit 208. It should be noted that the power supply line 206 and the ground line 207 are connected to each other in the board 201, the package 202, and the semiconductor integrated circuit 203.

The semiconductor integrated circuit 203 includes the logic circuit 208, for example. In the semiconductor integrated circuit 203, it may be a transistor level, a gate array, or a standard cell level, as long as a network can be formed.

In FIG. 2, the individual network of the board 201, the individual network of the package 202, and the individual network of the semiconductor integrated circuit 203 are connected to one another, to generate an integrated network formed by integrating the board 201, the package 202, and the semiconductor integrated circuit 203.

Exogenous noise pattern information is input from outside to the exogenous noise pattern generating unit 116 (FIG. 1) by a user using the user interface unit (not shown). Based on the exogenous noise pattern information, the exogenous noise pattern generating unit 116 generates an applied noise pattern (also referred to as an external noise pattern). In this case, based on the exogenous noise pattern information, the timing of insertion of the noise pattern, the shape of the noise pattern, and the insertion position of the noise pattern are set. As the settings are received as parameters, and, based on the received parameters, an applied noise pattern is generated.

Figure 3:
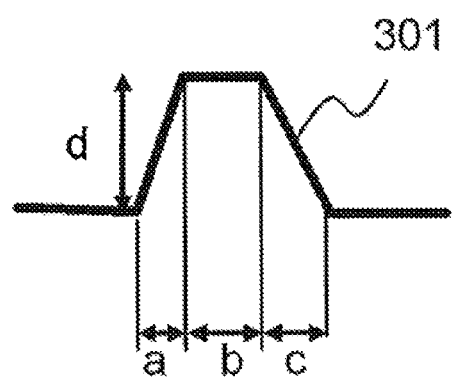
FIG. 3 is a diagram showing an applied noise pattern that is modeled on a trapezoidal wave according to the exemplary embodiment.

FIG. 3 shows an example of the applied noise pattern to be set. FIG. 3 is a diagram showing an applied noise pattern 301 that is modeled on a trapezoidal wave. The applied noise pattern 301 is formed by elements a, b, c, and d of the timing of the noise formation.

Figure 4:
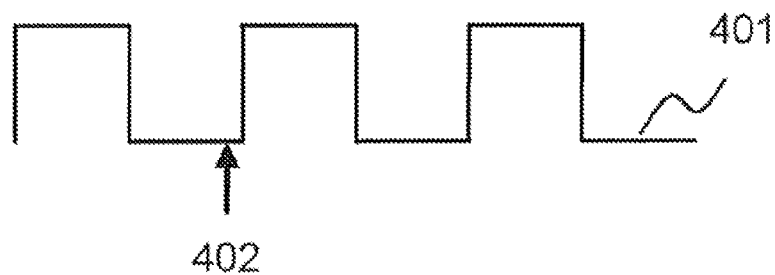
FIG. 4 is a diagram showing the timing of applying an applied noise pattern according to the exemplary embodiment.

FIG. 4 shows the timing of application of the applied noise pattern 301. The noise application timing 402 shown in FIG. 4 can be set according to an arbitrary signal 401, with a rise or fall time of the signal 401 being a starting point. In the example shown in FIG. 4, the timing of application of noise (noise application timing 402) is set before a rise time of the signal 401. It should be noted that the points to which noise is applied can set arbitrary coordinates of the board 201.

The noise pattern managing unit 117 manages the applied noise pattern generated by the exogenous noise pattern generating unit 116.

The exogenous noise applying unit 118 acquires the applied noise pattern generated by the exogenous noise pattern generating unit 116 from the noise pattern managing unit 117, and applies the applied noise pattern to the actual device (the semiconductor integrated circuit 203, for example).

A technique of applying a square-wave noise having an arbitrary shape to an arbitrary location according to an internal signal of a semiconductor integrated circuit has already been established. Accordingly, the generated applied noise pattern can be used by the existing technique.

The device analyzing unit 119 evaluates the actual device by measuring an operation performed in a case where the applied noise pattern is applied, and inputs device operation information as the evaluation results into the device operation information storage unit 120. The device operation information storage unit 120 stores the device operation information that is the results of the evaluation made on the actual device.

A technique of actually measuring an operation performed in a case where an applied noise pattern is applied has also already been established. Therefore, the existing technique can be used.

The exogenous noise applying unit 125 inserts the applied noise pattern managed by the noise pattern managing unit 117 to the semiconductor integrated LRC network generated by the integrated network generating unit 112.

The operation simulation running unit 113 performs an operation simulation, with the applied noise pattern being inserted as a noise source to the semiconductor integrated LRC network. It should be noted that the inserted noise source is transferred from the application position set by the exogenous noise pattern generating unit 116 to a position in the semiconductor integrated LRC network prior to insertion.

For example, as shown in FIG. 2, the noise source 205 is inserted to the power supply line 206 of the board 201.

Figure 5:
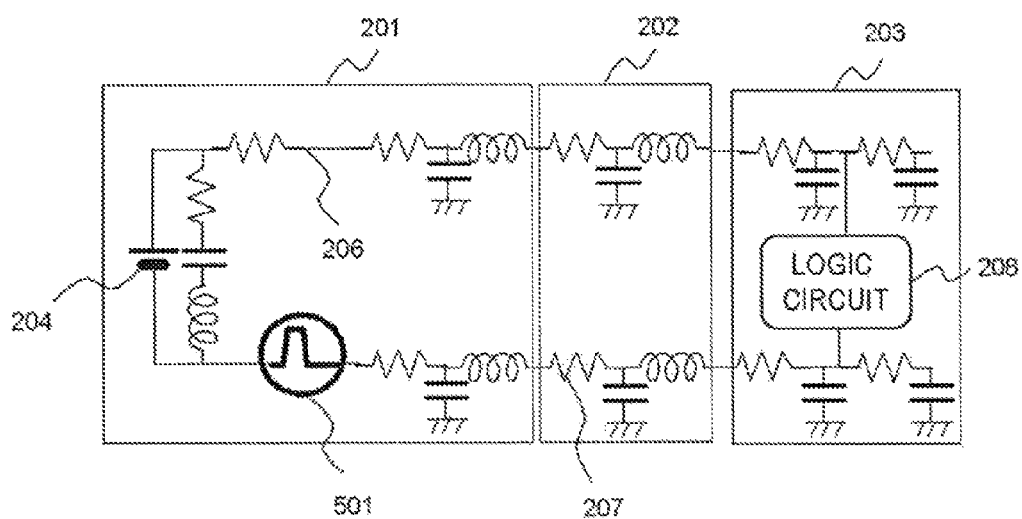
FIG. 5 is a diagram showing a case where a noise source is inserted to the ground line of a semiconductor integrated LRC network according to the exemplary embodiment.

FIG. 5 shows an example case where a noise source is inserted to the ground line 207. FIG. 5 is a diagram showing a case where a noise source 501 is inserted to the ground line 207 of the semiconductor integrated LRC network.

The noise analyzing unit 114 analyzes the results of the simulation of the semiconductor integrated LRC network. Since the operation simulation is performed where a noise source is inserted, the noise analyzing unit 114 can make a detailed analysis of the inside of the semiconductor integrated circuit 203.

Figure 6:
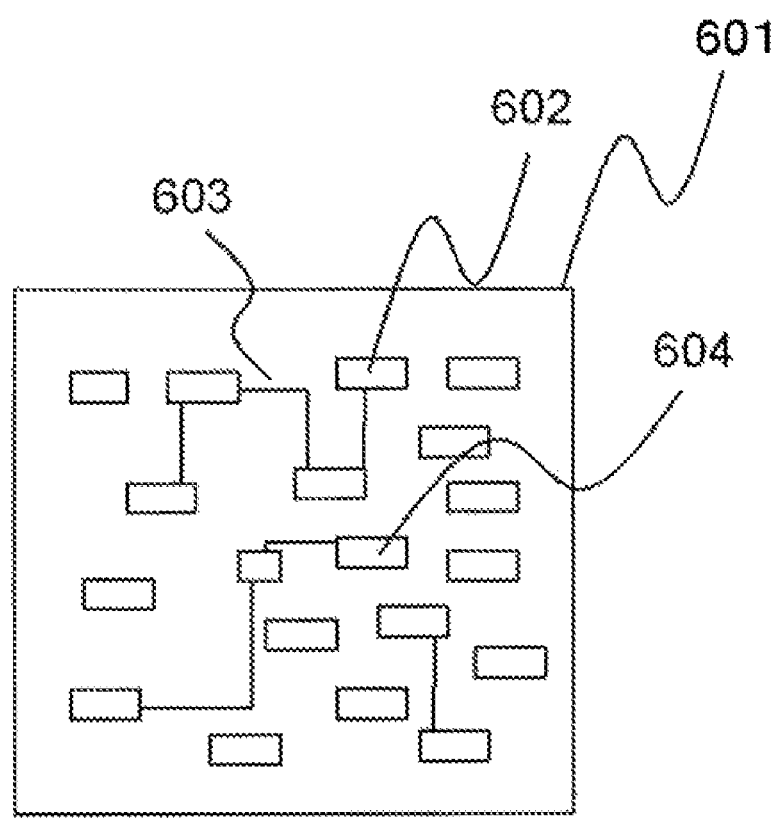
FIG. 6 is a diagram illustrating a detailed false operation cause analysis carried out on the semiconductor integrated circuit according to the exemplary embodiment.

FIG. 6 shows an example of this case. FIG. 6 is a diagram showing a case where a detailed false operation cause analysis is carried out on the semiconductor integrated circuit 203. For example, in a case where the semiconductor integrated circuit 203 is formed by a standard cell 601, the cause of a false operation can be specifically analyzed on the signal interconnect level (see a signal interconnect 603) with respect to a hard macro cell 602 in the standard cell 601, as shown in FIG. 6. The noise analyzing unit 114 inputs the analyzed analysis results to the simulating operation information storage unit 115. The simulating operation information storage unit 115 stores the analysis results analyzed by the noise analyzing unit 114.

A technique for transistor level simulations and a technique for standard cell level simulations have already been established. Accordingly, the existing techniques can be used.

It should be noted that "exogenous noise" in this exemplary embodiment is the noise that flows into a semiconductor integrated circuit, being conducted through the power supply, the ground, and a signal line connected to the semiconductor integrated circuit. Accordingly, as such noise flows into the semiconductor integrated circuit, the cause of a false operation in the semiconductor integrated circuit can be analyzed.

Also, a "semiconductor integrated circuit" in this exemplary embodiment is a collective term for devices, chips, LSIs (Large Scale Integrated Circuits), and the like, and normally includes structures regarded as semiconductors.

It should be noted that the various components of this exemplary embodiment are designed to realize the respective functions. For example, those components can be realized as special-purpose hardware having predetermined functions, the operation analyzing apparatus 100 having the predetermined functions provided by a computer program, the predetermined functions realized in the operation analyzing apparatus 100 by a computer program, or a combination of them.

The various components of this exemplary embodiment are not necessarily independent of one another. Instead, two or more components may be formed as a single block, a single component may be formed by two or more blocks, a component may be part of another component, and part of a component may also be part of another component, for example.

Figure 9:
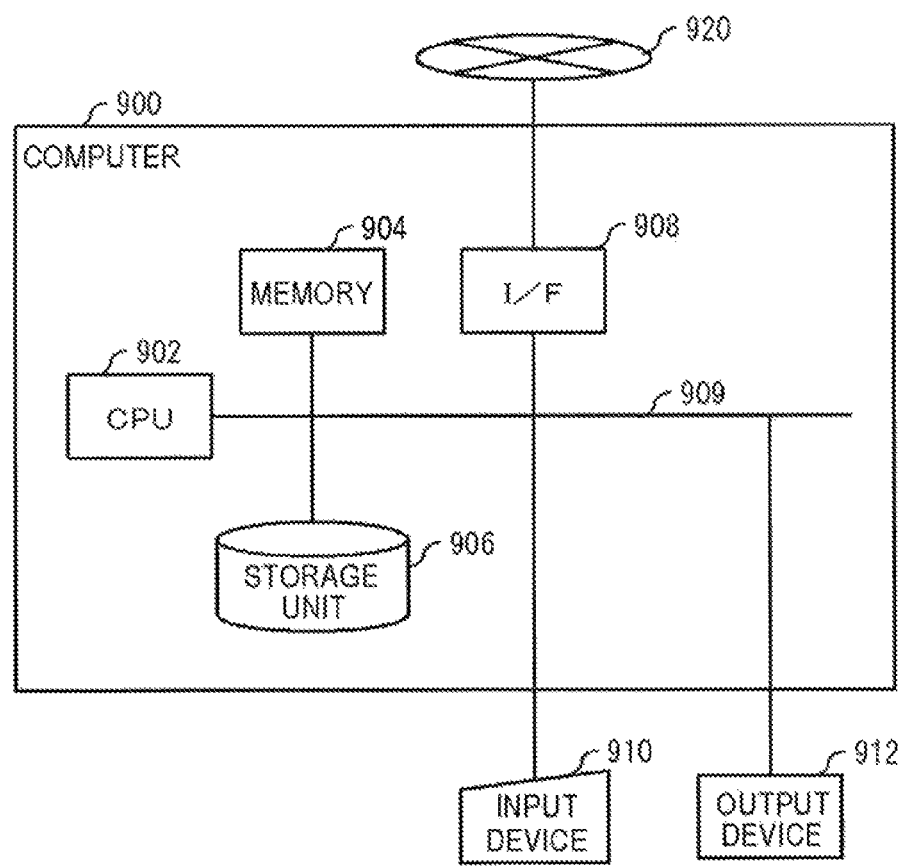
FIG. 9 is a block diagram showing an example structure of a computer that embodies the operation analyzing apparatus for semiconductor integrated circuits according to the exemplary embodiment.

So as to be able to read a computer program and perform the corresponding information processing operation, the operation analyzing apparatus 100 of this exemplary embodiment is realized by mainly a CPU (Central Processing Unit) 902, a memory 904 of an arbitrary computer 900 shown in FIG. 9, a program that is loaded into the memory 904 and is designed for realizing the components of the operation analyzing apparatus 100 of this exemplary embodiment, a storage unit 906 such as a hard disk that stores the program, and an interface (I/F) 908 for connecting to a network 920, and also hardware that is constructed by a general-purpose device, a special-purpose logic circuit designed for performing a predetermined information processing operation, and a combination of software. The computer 900 may be connected to an input device 910 such as a keyboard and a mouse, and an output device 912 such as a display or a printer, via I/O (Input and Output) units (not shown) for those input and output devices. In the computer 900, the CPU 902 is connected to the respective components of the computer 900 via a bus 909, and, in cooperation with the respective components, controls the entire computer 900. It is obvious to those skilled in the art that there are various modifications of the method and device for realizing the above. In the exemplary embodiments of the present invention, each drawing shows blocks of functions, instead of the hardware-based structures.

In this exemplary embodiment, causing the CPU 902 of the computer 900 realizing the operation analyzing apparatus 100 to perform various operations according to a computer program is also causing the CPU 902 of the computer 900 of the operation analyzing apparatus 100 to control operations of the respective blocks or the like.

The computer program of this exemplary embodiment may be recorded on a recording medium that can be read by the computer 900. The recording medium is not particularly limited, and various kinds of recording media can be used. Also, the program may be loaded from the recording medium into the memory 904 of the computer 900, or may be downloaded into the computer 900 via the network 920 and be loaded into the memory 904.

For example, causing the computer 900 realizing the operation analyzing apparatus 100 to register, store, memorize, hold, or save various kinds of information and data includes the following: the CPU 902 storing various kinds of information and data into an information storage device such as the storage unit 906 or the memory 904 fixed to the computer 900 realizing the operation analyzing apparatus 100; the CPU 902 storing various kinds of information and data, with a disk drive, into an information storage medium such as a CD-R (Compact Disk Recordable) or a DVD (Digital Versatile Disk) exchangeably mounted in the computer 900 realizing the operation analyzing apparatus 100; and downloading various kinds of information and data by communicating with another device (not shown) in the network 920 via the interface 908, and storing the various kinds of information and data into the information storage device or the information storage medium.

Figure 7:
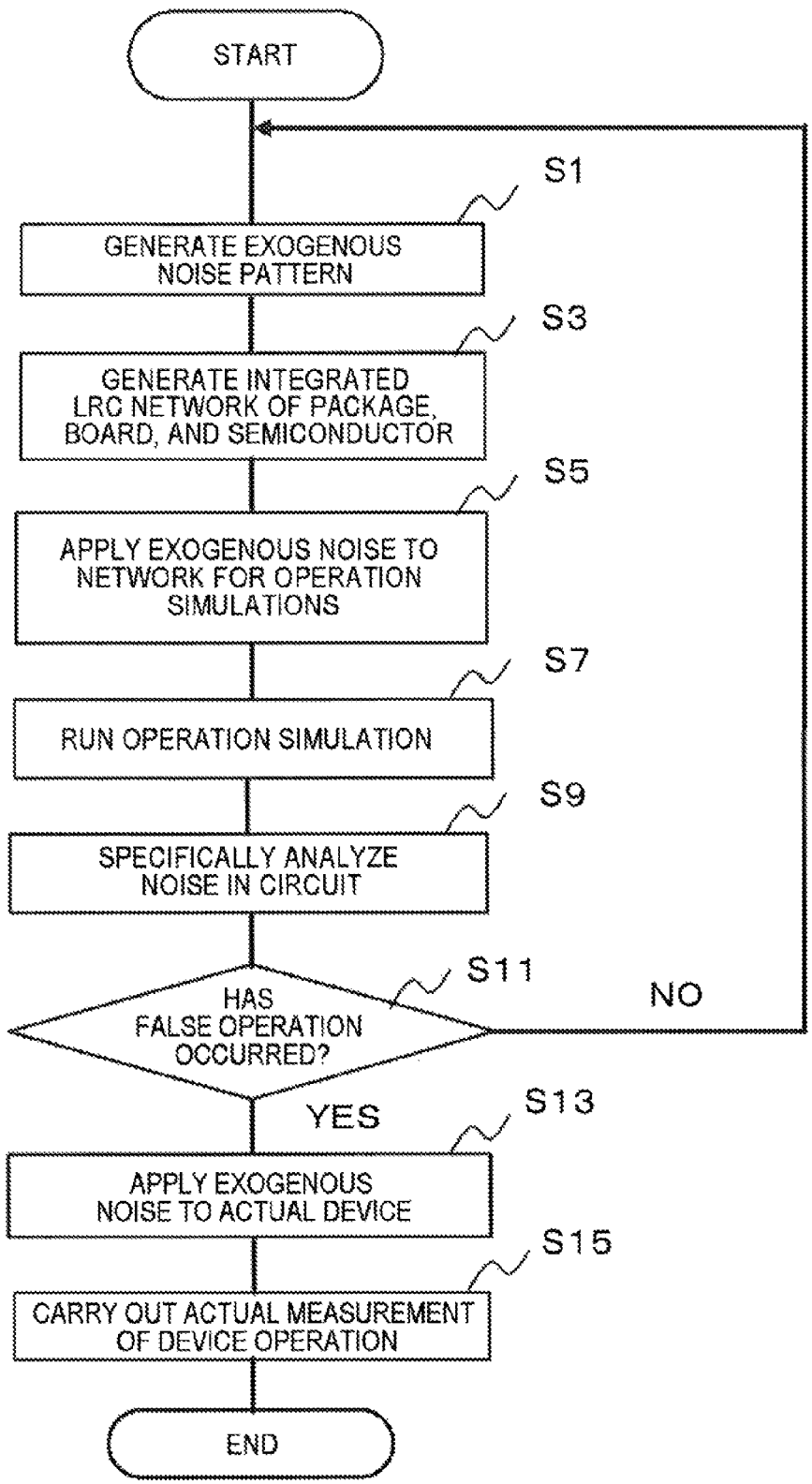
FIG. 7 is a flowchart showing an operation to be performed by an operation analyzing apparatus for semiconductor integrated circuits according to the exemplary embodiment.

Next, the operation of the operation analyzing apparatus 100 for semiconductor integrated circuits according to this exemplary embodiment is described, with reference to the drawings. FIG. 7 is a flowchart showing the operation to be performed by the operation analyzing apparatus 100. Referring to FIGS. 1, 7, and 9, the operation is described below.

The computer program of this exemplary embodiment is an operation analyzing program for semiconductor integrated circuits. The computer program is written to cause the computer 900 (FIG. 9) to perform: a semiconductor characteristics extracting procedure to extract the inductances, resistances, and capacitances of a semiconductor substrate, a package, and a semiconductor integrated circuit, from the semiconductor integrated circuit mounted on the semiconductor substrate via the package; an individual network generating procedure to generate individual networks of the extracted inductance, resistance, and capacitance with respect to each of the semiconductor substrate, the package, and the semiconductor integrated circuit; an integrated network generating procedure (step S3 of FIG. 7) to generate an integrated network by integrating all of the generated individual networks; and an operation simulating procedure (step S7 of FIG. 7) to perform a simulation of an operation of the semiconductor integrated circuit by inserting a test noise pattern to an arbitrary position of the generated integrated network (S5 of FIG. 7).

First, exogenous noise pattern information is received. The exogenous noise pattern information is input to the operation analyzing apparatus 100 by a user using a user interface (not shown) formed by the input device 910 (FIG. 9) such as a keyboard and a mouse of the computer 900 (FIG. 9) and the output device 912 (FIG. 9) such as a display. Acquiring the exogenous noise pattern information, the exogenous noise pattern generating unit 116 generates one applied noise pattern for an operation analysis, for example (step S1 of FIG. 7). After generating the applied noise pattern, the exogenous noise pattern generating unit 116 transmits the applied noise pattern to the noise pattern managing unit 117. After receiving the applied noise pattern, the noise pattern managing unit 117 manages the applied noise pattern.

The operation analyzing apparatus 100 acquires information with respect to package information, board information, and semiconductor integrated circuit information which is inputted by the user with the use of the user interface (not shown). The semiconductor characteristics extracting unit 110 extracts respective inductances L, resistances R, and capacitances C of the board 201, the package 202, and the semiconductor integrated circuit 203. The semiconductor characteristics extracting unit 110 transmits the extracted respective inductances L, resistances R, and capacitances C to the individual network generating unit 111.

After receiving the respective inductances L, resistances R, and capacitances C of the board 201, the package 202, and the semiconductor integrated circuit 203, the individual network generating unit 111 generates the respective individual networks of the inductances L, resistances R, and capacitances C with respect to the board 201, the package 202, and the semiconductor integrated circuit 203. The individual network generating unit 111 also transmits the generated individual networks of the board 201, the package 202, and the semiconductor integrated circuit 203, to the integrated network generating unit 112.

After receiving the individual networks of the board 201, the package 202, and the semiconductor integrated circuit 203, the integrated network generating unit 112 integrates the individual networks of the board 201, the package 202, and the semiconductor integrated circuit 203, to generate a semiconductor integrated LRC network (step S3 of FIG. 7). Having generated the semiconductor integrated LRC network, the integrated network generating unit 112 transmits the semiconductor integrated LRC network to the exogenous noise applying unit 125.

The noise pattern managing unit 117 then selects an applied noise pattern to be applied to the semiconductor LRC integrated network from the applied noise patterns that the noise pattern managing unit 117 manages. The noise pattern managing unit 117 then transmits the selected applied noise pattern to the exogenous noise applying unit 125. After receiving the applied noise pattern, the exogenous noise applying unit 125 inserts the applied noise pattern as a noise source to the semiconductor integrated LRC network received from the integrated network generating unit 112 (step S5 of FIG. 7). The exogenous noise applying unit 125 transmits the semiconductor integrated LRC network having the noise source inserted thereto, to the operation simulation running unit 113.

After receiving the semiconductor integrated LRC network having the noise source inserted thereto, the operation simulation running unit 113 performs an operation simulation, using the semiconductor integrated LRC network (step S7 of FIG. 7).

The noise analyzing unit 114 analyzes the results of the operation simulation of the semiconductor integrated LRC network having the noise source inserted thereto. Specifically, a check is made to determine whether a false operation cause location 604 is detected in the semiconductor integrated circuit 203 as shown in FIG. 6 (step S9 of FIG. 7). The noise analyzing unit 114 also stores the analysis results into the simulating operation information storage unit 115.

If the false operation cause location 604 is detected, the noise analyzing unit 114 determines that a false operation has occurred ("YES" in step S11 of FIG. 7), and notifies the exogenous noise applying unit 118 that a false operation has occurred. After receiving the notification that the false operation has occurred, the exogenous noise applying unit 118 applies the applied noise pattern having the false operation as exogenous noise (equivalent to the first exogenous noise) to the semiconductor integrated circuit 203 (the actual device) (step S13 of FIG. 7).

The reason that the noise analyzing unit 114 notifies the exogenous noise applying unit 118 of the occurrence of the false operation and applies the exogenous noise to the semiconductor integrated circuit 203 is that the conformity of the simulation results with the semiconductor integrated circuit 203 should be checked.

In this manner, the conformity of the results of the analysis through a simulation with an actual operation by the semiconductor integrated circuit 203 can be checked.

The device analyzing unit 119 evaluates the actual device by actually measuring the operation of the semiconductor integrated circuit 203 having the exogenous noise applied (step S15 of FIG. 7). The device analyzing unit 119 then stores the evaluation results as the device operation information into the device operation information storage unit 120.

If the false operation cause location 604 is not detected in step S11, on the other hand, the determination is made that a false operation has not occurred ("NO" in step S11 of FIG. 7). The operation then returns to step S1, and a new exogenous noise pattern is generated. The procedures of steps S1 through S9 are then repeated.

It should be noted that an exogenous noise pattern is not necessarily generated every time. Rather, the noise pattern managing unit 117 may manage exogenous noise patterns in advance, and sequentially shuffle the exogenous noise patterns every time a simulation is performed.

As described above, according to this exemplary embodiment, the operation analyzing apparatus 100 for semiconductor integrated circuits generates respective individual networks of the board 201, the package 202, and the semiconductor integrated circuit 203, based on input board information, package information, and semiconductor integrated circuit information. The operation analyzing apparatus 100 then integrates the respective individual networks, to generate a semiconductor integrated LRC network.

The operation analyzing apparatus 100 can perform a simulation by inserting an arbitrary noise source to the generated semiconductor integrated LRC network. Accordingly, the operation analyzing apparatus 100 can accurately analyze the influence of noise entering the semiconductor integrated circuit 203 on operations. The noise enters the semiconductor integrated circuit 203 via the power supply line 206 and the ground line 207 of the board 201 and the package 202.

Accordingly, the operation analyzing apparatus 100 can accurately analyze the operation of a semiconductor integrated circuit, with the influence of exogenous noise being taken into consideration.

Although an exemplary embodiment of the present invention has been described so far with reference to the drawings, it is merely an example of the present invention, and various structures other than the above may be employed.
(Second Exemplary Embodiment)

In the first exemplary embodiment, the operation analyzing apparatus 100 for semiconductor integrated circuits generates a semiconductor integrated LRC network, based on package information, board information, and semiconductor integrated circuit information, as described with reference to the procedure of step S3 of FIG. 7, and performs an operation simulation in the procedure of step S7.

In a second exemplary embodiment, the processing order is changed by replacing the procedures of steps S3 through S9 of FIG. 7 with the procedures of steps S13 and S15. In this case, an applied noise pattern (equivalent to the second exogenous noise) is first applied to the semiconductor integrated circuit 203 (the actual device) (step S13 of FIG. 8). The operation of the semiconductor integrated circuit 203 is actually measured to evaluate the actual device (step S15 of FIG. 8). If a false operation occurs due to the applied noise pattern ("YES" in step S20 of FIG. 8), a semiconductor integrated LRC network is generated, and a noise source (or the second exogenous noise) having the false operation caused is inserted to the semiconductor integrated LRC network. An operation simulation is then performed.

Figure 8:
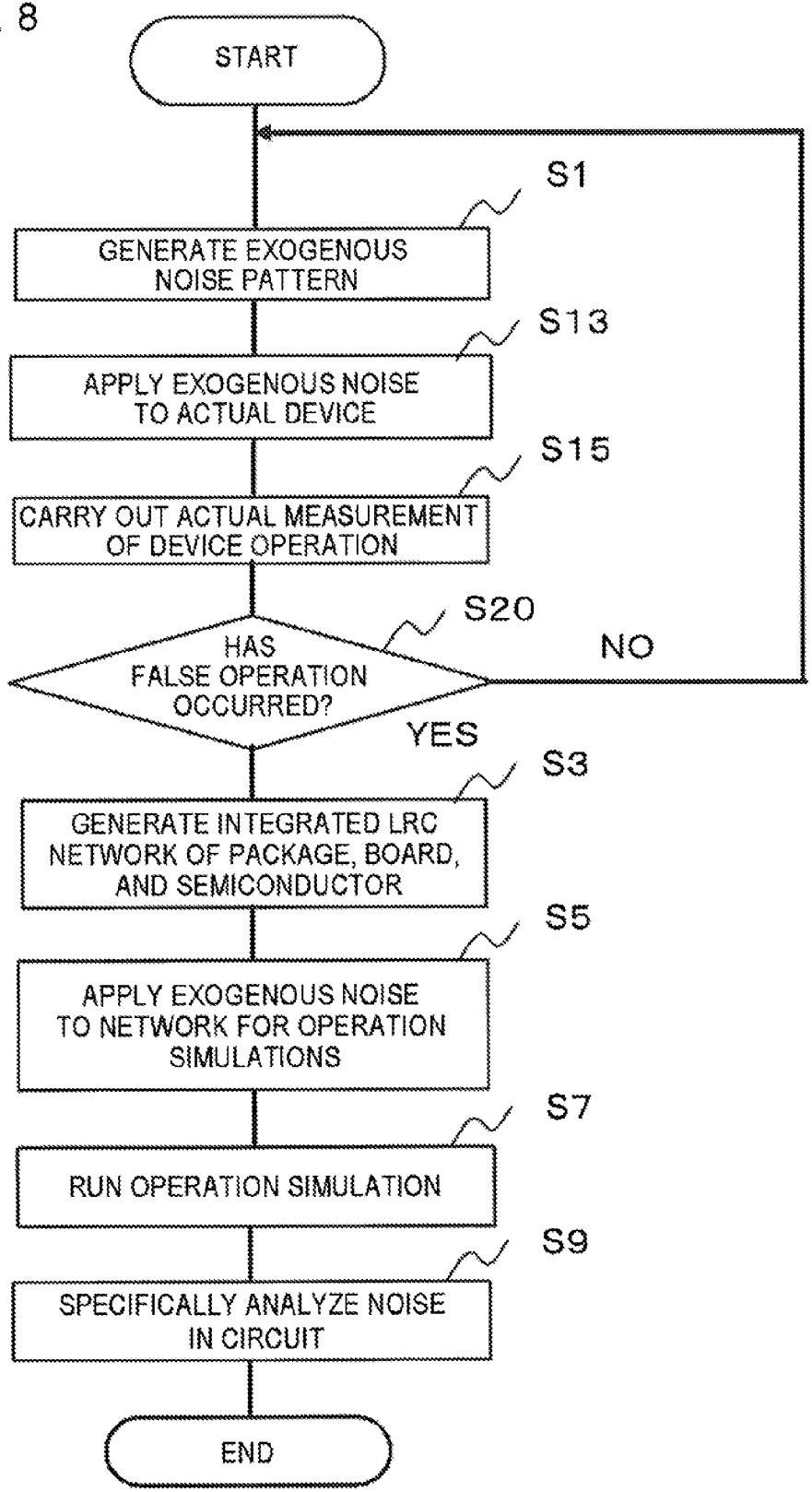
FIG. 8 is a flowchart showing an operation to be performed by an operation analyzing apparatus for semiconductor integrated circuits according to the exemplary embodiment.

The operation of the operation analyzing apparatus 100 according to the second exemplary embodiment is shown in a drawing. FIG. 8 is a flowchart showing the operation of the operation analyzing apparatus 100 according to the second exemplary embodiment.

The flowchart shown in FIG. 8 shows the same procedure steps as those in the flowchart shown in FIG. 7 in terms of contents. That is, only the processing order is changed, but the fundamental contents of the procedures are not changed in this case. The only change in the contents of the procedures is that, in step S20, the device analyzing unit 119 determines whether a false operation has occurred.

With this structure, the operation analyzing apparatus 100 for semiconductor integrated circuits according to the second exemplary embodiment can analyze the operation of a semiconductor integrated circuit, with the influence of exogenous noise being taken into consideration, as in the first exemplary embodiment.

The applied noise pattern to be applied can be shared between an operation simulation and a device analysis through actual measurement. Accordingly, an analysis can be made by carrying out a device analysis through actual measurement with the use of an applied noise pattern having a false operation in an operation simulation, and an operation simulation can be performed with the use of an applied noise pattern having a false operation in a device analysis through actual measurement.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

Exemplary embodiments of the present invention may also include the following exemplary embodiments.

1) A false operation analyzing method for analyzing an operation of a semiconductor integrated circuit, the method including:

a semiconductor characteristics extracting step of extracting respective inductances, resistances, and capacitances of a semiconductor substrate, a package, and the semiconductor integrated circuit, from the semiconductor integrated circuit mounted on the semiconductor substrate via the package;

an individual network generating step of generating respective individual networks of the semiconductor substrate, the package, and the semiconductor integrated circuit, based on the extracted inductances, resistances, and capacitances;

an integrated network generating step of generating an integrated network by integrating the generated individual networks; and a false operation simulating step of inserting a test noise pattern to a position in the generated integrated network, and performing a false operation simulation of the semiconductor integrated circuit.

2) The false operation analyzing method of 1), characterized in that the test noise pattern is generated by setting parameters that are the timing of inserting the test noise pattern, the shape of the test noise pattern, and the insertion position of the test noise pattern.

3) The false operation analyzing method of 1) or 2), characterized by further including:
a noise analyzing step of analyzing a false operation with the use of the inserted test noise pattern, based on the results of the performed false operation simulation;
an exogenous noise applying step of applying the test noise pattern as first exogenous noise from outside the semiconductor integrated circuit, where the analyzed false operation has occurred due to the test noise pattern; and
a device analyzing step of carrying out a device analysis through an actual operation with the applied first exogenous noise.

4) The false operation analyzing method of any one of 1) through 3), characterized by further including:
a second exogenous noise applying step of applying second exogenous noise from outside the semiconductor integrated circuit; and
a second device analyzing step of carrying out a device analysis through an actual operation with the applied second exogenous noise,
the false operation simulating step including inserting the second exogenous noise as the test noise pattern to a position in the integrated network, and performing a false operation simulation of the semiconductor integrated circuit, when a false operation is detected as a result of the device analysis.

5) A false operation analyzing apparatus having a simulation analyzing unit that analyzes an operation of a semiconductor integrated circuit,
the simulation analyzing unit includes:
a semiconductor characteristics extracting unit that extracts respective inductances, resistances, and capacitances of a semiconductor substrate, a package, and the semiconductor integrated circuit, from the semiconductor integrated circuit mounted on the semiconductor substrate via the package;
an individual network generating unit that generates respective individual networks of the semiconductor substrate, the package, and the semiconductor integrated circuit, based on the extracted inductances, resistances, and capacitances;
an integrated network generating unit that generates an integrated network by integrating the generated individual networks; and
a false operation simulating unit that inserts a test noise pattern to a position in the generated integrated network, and performs a false operation simulation of the semiconductor integrated circuit.

6) The false operation analyzing apparatus of 5), characterized in that the test noise pattern is generated by setting parameters that are the timing of inserting the test noise pattern, the shape of the test noise pattern, and the insertion'position of the test noise pattern.

7) The false operation analyzing apparatus of 5) or 6), characterized by further including an actual operation device analyzing unit that carries out a device analysis of an operation of the semiconductor integrated circuit through an actual operation,
the simulation analyzing unit including a noise analyzing unit that analyzes a false operation with the use of the inserted test noise pattern, based on the results of the performed false operation simulation,
the actual operation device analyzing unit including:
an exogenous noise applying unit that applies the test noise pattern as first exogenous noise from outside the semiconductor integrated circuit, where the analyzed false operation has occurred due to the test noise pattern; and
a device analyzing unit that carries out a device analysis through an actual operation with the applied first exogenous noise.

8) The false operation analyzing apparatus of any one of 5) through 7), characterized by further including an actual operation device analyzing unit that carries out a device analysis of an operation of the semiconductor integrated circuit through an actual operation,
the actual operation device analyzing unit including:
a second exogenous noise applying unit that applies second exogenous noise from outside the semiconductor integrated circuit; and
a second device analyzing unit that carries out a device analysis through an actual operation with the applied second exogenous noise,
the false operation simulating unit inserting the second exogenous noise as the test noise pattern to an arbitrary position in the integrated network, and performing a false operation simulation of the semiconductor integrated circuit, when a false operation is detected as a result of the device analysis.

9) A false operation analyzing program for causing a computer to perform a simulation analyzing process to analyze an operation of a semiconductor integrated circuit,
the simulation analyzing process includes:
a semiconductor characteristics extracting procedure to extract respective inductances, resistances, and capacitances of a semiconductor substrate, a package, and the semiconductor integrated circuit, from the semiconductor integrated circuit mounted on the semiconductor substrate via the package;
an individual network generating procedure to generate respective individual networks of the semiconductor substrate, the package, and the semiconductor integrated circuit, based on the extracted inductances, resistances, and capacitances;
an integrated network generating procedure to generate an integrated network by integrating the generated individual networks; and
a false operation simulating procedure to insert a test noise pattern to an arbitrary position in the generated integrated network, and perform a false operation simulation of the semiconductor integrated circuit.

10) A false operation analyzing system including a simulation analyzing unit that analyzes an operation of a semiconductor integrated circuit, and an actual operation device analyzing unit that carries out a device analysis of the operation of the semiconductor integrated circuit through an actual operation,
the simulation analyzing unit includes:
a semiconductor characteristics extracting unit that extracts respective inductances, resistances, and capacitances of a semiconductor substrate, a package, and the semiconductor integrated circuit, from the semiconductor integrated circuit mounted on the semiconductor substrate via the package;
an individual network generating unit that generates respective individual networks of the semiconductor substrate, the package, and the semiconductor integrated circuit, based on the extracted inductances, resistances, and capacitances;
an integrated network generating unit that generates an integrated network by integrating the generated individual networks;
a false operation simulating unit that inserts a test noise pattern to an arbitrary position in the generated integrated network, and performs a false operation simulation of the semiconductor integrated circuit; and a noise analyzing unit that analyzes a false operation with the use of the inserted test noise pattern, based on the results of the performed false operation simulation, the actual operation device analyzing unit including: an exogenous noise applying unit that applies the test noise pattern as first exogenous noise from outside the semiconductor integrated circuit, where the analyzed false operation has occurred due to the test noise pattern; and a device analyzing unit that carries out a device analysis through an actual operation with the applied first exogenous noise.

The invention claimed is:

1. A method of analyzing an operation of a semiconductor integrated circuit, comprising:
    extracting, by using a computer, respective inductances, resistances, and capacitances of a semiconductor substrate, a package, and said semiconductor integrated circuit, from said semiconductor integrated circuit mounted on said semiconductor substrate via said package;
    generating, by using said computer, individual networks of the extracted inductance, resistance, and capacitance with respect to each of said semiconductor substrate, said package, and said semiconductor integrated circuit;
    generating, by using said computer, an integrated network by integrating all of said individual networks generated;
    inserting, by using said computer, a test noise pattern to an arbitrary position as a noise source in said integrated network generated, and performing an operation simulation of said semiconductor integrated circuit, using said integrated network with said test noise pattern being inserted as said noise source;
    analyzing, by using said computer, a result of said operation simulation performed, and detecting a false operation occurring due to said noise source;
    performing, by using said computer, said operation simulation with a new test noise pattern being inserted as another noise source when said false operation is not detected in said operation simulation;
    applying, by using said computer, said test noise pattern corresponding to said noise source as an exogenous noise from outside said semiconductor integrated circuit, when said false operation detected is caused by said noise source; and
    carrying out, by using said computer, a device analysis through an actual operation of said semiconductor integrated circuit to which said exogenous noise applied, thereby checking the conformity of the results of the analysis through said operation simulation with said actual operation by said semiconductor integrated circuit.

2. The method as claimed in claim 1, further comprising:
    receiving, by using said computer, as parameters, timing of inserting said test noise pattern, a shape of said test noise pattern, and an insertion position of said test noise; and
    generating, by using said computer, said test noise pattern based on said parameters received to insert the generated test noise.

3. A method of analyzing an operation of a semiconductor integrated circuit, comprising:
    extracting, by using a computer, respective inductances, resistances, and capacitances of a semiconductor substrate, a package, and said semiconductor integrated circuit, from said semiconductor integrated circuit mounted on said semiconductor substrate via said package;
    generating, by using said computer, individual networks of the extracted inductance, resistance, and capacitance with respect to each of said semiconductor substrate, said package, and said semiconductor integrated circuit;
    generating, by using said computer, an integrated network by integrating all of said individual networks generated;
    inserting, by using said computer, a test noise pattern to an arbitrary position as a noise source in said integrated network generated, and performing an operation simulation of said semiconductor integrated circuit, using said integrated network with said test noise pattern being inserted as said noise source;
    wherein said method further comprising:
    applying, by using said computer, said test noise pattern as an exogenous noise from outside said semiconductor integrated circuit before performing said operation simulation;
    carrying out, by using said computer, a device analysis through an actual operation of said semiconductor integrated circuit to which said exogenous noise is applied, and detecting a false operation occurring due to said exogenous noise; and
    performing, by using said computer, said device analysis with a new test noise pattern being applied as another exogenous noise when a false operation is not detected in said semiconductor integrated circuit as a result of said device analysis,
    in said performing the operation simulation,
    inserting, by using said computer, the test noise pattern corresponding to said exogenous noise to an arbitrary position in said integrated network and performing said operation simulation of said semiconductor integrated circuit, using said integrated network with the applied noise pattern being inserted, when a false operation is detected in said semiconductor integrated circuit as a result of said device analysis, thereby checking the conformity of the results of said operation simulation with said actual operation by said semiconductor integrated circuit.

4. The method as claimed in claim 3, further comprising:
    receiving, by using said computer, as parameters, timing of inserting said test noise pattern, a shape of said test noise pattern, and an insertion position of said test noise pattern; and
    generating, by using said computer, said test noise pattern based on said parameters received to insert the generated test noise.

5. An apparatus for analyzing an operation of a semiconductor integrated circuit, comprising:
    a semiconductor characteristics extracting unit which extracts respective inductances, resistances, and capacitances of a semiconductor substrate, a package, and said semiconductor integrated circuit, from said semiconductor integrated circuit mounted on said semiconductor substrate via said package;
    an individual network generating unit which generates individual networks of the extracted inductance, resistance, and capacitance with respect to each of said semiconductor substrate, said package, and said semiconductor integrated circuit;
    an integrated network generating unit which generates an integrated network by integrating said all of individual networks generated;
    an operation simulating unit which inserts a test noise pattern to an arbitrary position as a noise source in said integrated network generated, and performs an operation simulation of said semiconductor integrated circuit, using said integrated network with said test noise pattern being inserted as said noise source;

a noise analyzing unit which analyzes a result of said operation simulation performed, and detects a false operation occurring due to the inserted noise source;

an exogenous noise applying unit which applies said test noise pattern corresponding to said noise source as an exogenous noise from outside said semiconductor integrated circuit, when said false operation detected is caused by said noise source; and a device analyzing unit which carries out a device analysis through an actual operation of said semiconductor integrated circuit to which said exogenous noise is applied, thereby checking the conformity of the results of the analysis through said operation simulation with said actual operation by said semiconductor integrated circuit, wherein said operation simulating unit perform said operation simulation with a new test noise pattern being inserted as another noise source when said false operation is not detected in said operation simulation; and wherein said apparatus further comprises a processor implementing at least one of: the semiconductor characteristics extracting unit, the individual network generating unit, the integrated network generating unit, the operation simulating unit, the noise analyzing unit, and the device analyzing unit.

6. The apparatus as claimed in claim 5, wherein said operation simulating unit receives, as parameters, timing of inserting said test noise pattern, a shape of said test noise pattern, and an insertion position of said test noise pattern, and generates said test noise pattern based on said parameters received to insert the generated test noise.

7. An apparatus for analyzing an operation of a semiconductor integrated circuit, comprising:

a semiconductor characteristics extracting unit which extracts respective inductances, resistances, and capacitances of a semiconductor substrate, a package, and said semiconductor integrated circuit, from said semiconductor integrated circuit mounted on said semiconductor substrate via said package;

an individual network generating unit which generates individual networks of the extracted inductance, resistance, and capacitance with respect to each of said semiconductor substrate, said package, and said semiconductor integrated circuit;

an integrated network generating unit which generates an integrated network by integrating said all of individual networks generated;

an operation simulating unit which inserts a test noise pattern to an arbitrary position as a noise source in said integrated network generated, and performs an operation simulation of said semiconductor integrated circuit, using said integrated network with said test noise pattern being inserted as said noise source;

an exogenous noise applying unit which applies said test noise pattern as an exogenous noise from outside said semiconductor integrated circuit before performing said operation simulation; and a device analyzing unit which carries out a device analysis through an actual operation of said semiconductor integrated circuit to which said exogenous noise is applied, said operation simulating unit inserts the test noise pattern corresponding to said exogenous noise to an arbitrary position in said integrated network and performs said operation simulation of said semiconductor integrated circuit, using said integrated network with the applied noise pattern being inserted, when a false operation is detected in said semiconductor integrated circuit as a result of said device analysis, thereby checking the conformity of the results of said operation simulation with said actual operation by said semiconductor integrated circuit, wherein said device analyzing unit performs device analysis with a new test noise pattern being applied as another exogenous noise when a false operation is not detected in said semiconductor integrated circuit as a result of said device analysis; and wherein said apparatus further comprises a processor implementing at least one of: the semiconductor characteristics extracting unit, the individual network generating unit, the integrated network generating unit, the operation simulating unit, the exogenous noise applying unit, and the device analyzing unit.

8. The apparatus as claimed in claim 7, wherein said operation simulating unit receives, as parameters, timing of inserting said test noise pattern, a shape of said test noise pattern, and an insertion position of said test noise pattern, and generates said test noise pattern based on said parameters received to insert the generated test noise.

9. A system for analyzing an operation of a semiconductor integrated circuit, comprising:

at least one processor;

said processor executing a program read from a storage medium storing said program thereon to realize:

a semiconductor characteristics extracting unit which extracts respective inductances, resistances, and capacitances of a semiconductor substrate, a package, and said semiconductor integrated circuit, from said semiconductor integrated circuit mounted on said semiconductor substrate via said package;

an individual network generating unit which generates individual networks of the extracted inductance, resistance, and capacitance with respect to each of said semiconductor substrate, said package, and said semiconductor integrated circuit;

an integrated network generating unit which generates an integrated network by integrating all of said individual networks generated;

an operation simulating unit which inserts a test noise pattern to an arbitrary position as a noise source in said integrated network generated, and performs an operation simulation of said semiconductor integrated circuit, using said integrated network with said test noise pattern being inserted as said noise source;

a noise analyzing unit which analyzes a result of said operation simulation performed to detect a false operation occurring due to the inserted noise source;

an exogenous noise applying unit which applies said test noise pattern corresponding to said noise source as an exogenous noise from outside said semiconductor integrated circuit, when said false operation detected is caused by said noise source; and a device analyzing unit which carries out a device analysis through an actual operation of said semiconductor integrated circuit to which said exogenous noise is applied, thereby checking the conformity of the results of the analysis through said operation simulation with said actual operation by said semiconductor integrated circuit, wherein said operation simulating unit performs said operation simulation with a new test noise pattern being inserted as another noise source when said false operation is not detected in said operation simulation.

* * * * *